(12) United States Patent
Lai et al.

(10) Patent No.: US 7,264,676 B2
(45) Date of Patent: Sep. 4, 2007

(54) PLASMA APPARATUS AND METHOD CAPABLE OF ADAPTIVE IMPEDANCE MATCHING

(75) Inventors: Chien-Hsin Lai, Kaohsiung (TW); San-An Lin, Tainan (TW); Kuo-En Yen, Tainan (TW); Kuo-Uei Huang, Chya-I (TW)

(73) Assignee: United Microelectronics Corp., Hsin-Chu (TW)

( * ) Notice: Subject to any disclaimer, the term of this patent is extended or adjusted under 35 U.S.C. 154(b) by 291 days.

(21) Appl. No.: 10/659,258

(22) Filed: Sep. 11, 2003

(65) Prior Publication Data

US 2005/0056369 A1   Mar. 17, 2005

(51) Int. Cl.
*C23C 16/00* (2006.01)
*H01L 21/00* (2006.01)
*C23F 1/00* (2006.01)

(52) U.S. Cl. .............. 118/728; 118/723 R; 156/345.28; 156/345.51; 279/128; 361/234

(58) Field of Classification Search ........... 156/345.28, 156/345.51; 118/728; 204/298.08; 279/128; 361/233–234; 315/111.21
See application file for complete search history.

(56) References Cited

U.S. PATENT DOCUMENTS

| | | | |
|---|---|---|---|
| 5,187,454 A * | 2/1993 | Collins et al. ............. 333/17.3 |
| 5,452,510 A * | 9/1995 | Barnes et al. ................. 29/825 |
| 5,812,361 A * | 9/1998 | Jones et al. .................. 361/234 |
| 5,835,333 A * | 11/1998 | Castro et al. ................ 361/234 |
| 5,843,827 A | 12/1998 | Gregor et al. |
| 5,894,400 A * | 4/1999 | Graven et al. ............... 361/234 |
| 5,900,062 A * | 5/1999 | Loewenhardt et al. .. 118/723 R |
| 5,913,140 A | 6/1999 | Roche et al. |
| 5,933,314 A * | 8/1999 | Lambson et al. ........... 361/234 |
| 5,946,184 A * | 8/1999 | Kanno et al. ................ 361/234 |
| 6,117,345 A | 9/2000 | Liu et al. |
| 6,215,640 B1 * | 4/2001 | Hausmann ................... 361/234 |
| 6,218,284 B1 | 4/2001 | Liu et al. |
| 6,228,278 B1 * | 5/2001 | Winniczek et al. ........... 216/61 |
| 6,239,018 B1 | 5/2001 | Liu et al. |
| 6,252,354 B1 * | 6/2001 | Collins et al. .......... 315/111.51 |
| 6,414,562 B1 * | 7/2002 | Bouisse et al. ................ 333/32 |
| 6,562,190 B1 * | 5/2003 | Kuthi et al. ........... 156/345.44 |
| 6,625,003 B2 * | 9/2003 | Loo et al. .................... 361/234 |
| 6,741,446 B2 * | 5/2004 | Ennis .......................... 361/234 |
| 2002/0159216 A1 * | 10/2002 | Ennis .......................... 361/234 |
| 2004/0163594 A1 * | 8/2004 | Windhorn ............... 118/723 E |

* cited by examiner

Primary Examiner—Karla Moore

(57) ABSTRACT

A plasma apparatus capable of adaptive impedance matching comprises a plasma reactor which can produce plasma to proceed with CVD (chemical vapor deposition) process, a bi-polar electrostatic chuck which locates inside the plasma reactor and is used to support and secure a wafer, an alternating current bias power supply which connects to the bi-polar electrostatic chuck supplies the voltage potential bias for ion-bombardment from plasma, and an impedance-matching circuit which connects the alternating current bias power supply to the bi-polar electrostatic chuck is used to balance the inner electrode power output and the outer electrode power output of the bi-polar electrostatic chuck.

13 Claims, 6 Drawing Sheets

PLASMA APPARATUS AND METHOD CAPABLE OF ADAPTIVE IMPEDANCE MATCHING

BACKGROUND OF THE INVENTION

1. Field of the Invention

The present invention relates to an apparatus of the fabrication of integrated circuits, and the present invention especially relates to an apparatus of the fabrication of integrated circuits which is capable of reducing gate oxide damage in a high density plasma chemical vapor deposition process to which a bi-polar electrostatic chuck is applied.

2. Description of the Prior Art

After the fabrication of the active device of a MOS (metal-oxide semiconductor) device is accomplished, the following work is to proceed the fabrication of the multi-level interconnects above the MOS device. As the process technology progresses and scales of MOS devices get more and more smaller, gaps between metal conductors also become more and more narrower. Accordingly, gaps of high aspect ratio between metal conductors are formed. The gaps of high aspect ration will let the deposition of dielectric layers become incomplete and form voids in the dielectric layers. These voids in the dielectric layers will damage electric properties of MOS devices and lead to scraped wafers.

In order to solve the problem of the incomplete deposition of dielectric layers, a HDPCVD (high density plasma chemical vapor deposition) process is proposed to deposit dielectric layers between metal conductors in U.S. Pat. No. 6,239,018 and U.S. Pat. No. 6,218,284. The detailed description of a HDPCVD process is also contained in U.S. Pat. No. 6,117,345. The main reason a HDPCVD process can solve the problem of the incomplete deposition of dielectric layers is that a HDPCVD process is capable of both proceeding chemical vapor deposition process and anisotropic etching process. As shown in FIG. 1A, the etching function results from the following steps: an AC (alternating current) plasma generating source 12 of the HDPCVD equipment 10 generates plasma 16, the voltage potential difference between the plasma 16 and the electrostatic chuck 20 attracts the ions of the plasma 16 to bombard the wafer 18. The ions of the plasma 16 will anisotropically etch the excess dielectric layers above the metal conductors of MOS devices to deposit void-free dielectric layers. Because the voltage potential difference between the plasma 16 and the electrostatic chuck 20 distributes non-uniformly in the process of ion-bombardment on the wafer 18, currents are produced on the wafer 18 surface. If the voltage potential difference between the plasma 16 and the electrostatic chuck 20 distributes extremely non-uniformly, the produced currents will damage gate oxides of MOS devices.

The non-uniform distribution of the voltage potential difference between the plasma 16 and the electrostatic chuck 20 possibly results from the non-uniform distribution of the voltage potential on the electrostatic chuck 20. In HDPCVD equipment, the type of an electrostatic chuck 20 includes mono-polar and bi-polar. The electrostatic chuck 20 secures the wafer 18 by means of the electrostatic force. If the electrostatic chuck 20 has only one electrode, the distribution of the voltage potential on the electrostatic chuck 20 can be deemed uniform distribution and will not cause the aforementioned non-uniform distribution of the voltage potential difference between the plasma 16 and the electrostatic chuck 20. However, the electrostatic chuck 20 of the mono-polar type does not have a discharging circuit. When the HDPCVD process is over, the wafer 18 cannot be moved until the electric particles in the plasma 16 neutralize the inductive electric particles on the wafer 18. The neutralization process delays the throughput of mass production and if the wafer 18 is moved before the neutralization process is completed, the wafer 18 may be broken into fragments.

A bi-polar electrostatic chuck 201 is as shown in FIG. 1B. If a bi-polar electrostatic chuck 201 is used in the HDPCVD process, after the HDPCVD process is over, the electrostatic force on the wafer 18 will be removed more rapidly by virtue of the discharging circuit created by the double electrodes. The discharging circuit created by the double electrodes can avoid delaying the throughput of mass production and prevent the wafer 18 from being broken into fragments. However, as shown in FIG. 1C, the AC bias source 22 of producing ion-bombardment also connects to the inner electrode 28 and outer electrode 30 of the bi-polar electrostatic chuck 201 to produce the voltage potential difference between the plasma 16 and the bi-polar electrostatic chuck 201. Accordingly in the process of the transmission of high frequency AC currents, the inner electrode 28 power output always differs from the outer electrode 30 power output because of the impedance difference of the transmitting lines between the inner electrode 28 and the outer electrode 30 causing the non-uniform voltage potential distribution on the bi-polar electrostatic chuck 201. As shown in FIG. 2A, after ions bombard the inner side and outer side of the wafer 18, different voltage potential on the wafer 18 will be generated to produce surface currents on the wafer 18. As shown in FIG. 2B, the surface currents on the wafer 18 will cause the accumulated electric particles on the conductive polysilicon layer 36. The gate oxide 38 on the silicon substrate 40 will be damaged by the accumulated electric particles passing through the gate oxide 38.

In order to solve the problem of the gate oxide damage, process steps are added to change the structure of the MOS device in the U.S. Pat. No. 5,913,140 and U.S. Pat. No. 5,843,827. However, the problem of the non-uniform voltage potential difference between the plasma 16 and the bi-polar electrostatic chuck 201 is not mentioned in these patents. Accordingly, how to avoid the non-uniform voltage potential difference between the plasma 16 and the bi-polar electrostatic chuck 201 is an important issue to be solved.

SUMMARY OF THE INVENTION

The main purpose of the present invention is to solve the aforementioned problem of the non-uniform voltage potential difference between the plasma and the bi-polar electrostatic chuck. The present invention provides a solution which adds an impedance-matching circuit between the AC bias power for generating the ion-bombardment and the bi-polar electrostatic chuck. The impedance-matching circuit can regulate the impedance of the inner electrode and the outer electrode of the bi-polar electrostatic chuck to balance the inner electrode power output and the outer electrode power output. Furthermore, the impedance-matching circuit can lead to a uniform voltage potential difference between the plasma and the bi-polar electrostatic chuck to avoid the gate oxide damage caused by plasma. According to the experiment results, the fail rate of dies of a wafer decreases from 30%~60% without adding the impedance-matching circuit to 0%~2% with adding the impedance-matching circuit.

The impedance-matching circuit provided by the present invention includes a power-measuring device which can measure the voltage and the current of both the inner electrode and the outer electrode of the bi-polar electrostatic chuck and transform the voltage values and the current values into power output values of both the inner electrode and the outer electrode of the bi-polar electrostatic chuck, a power comparator which can compare the power value of the inner electrode and the power value of the outer electrode to get a control signal, and an automatic impedance-regulator which can receive the control signal to drive the logic drive motors to regulate the impedance values of the adjustable impedance-elements to let the inner electrode and the outer electrode of the bi-polar electrostatic chuck have the same power output.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some embodiments of the invention will be described exquisitely as below. Besides, the invention can also be practiced extensively in other embodiments. That is to say, the scope of the invention should not be restricted by the proposed embodiments. The scope of the invention should be based on the claims proposed later.

Figure 1A:
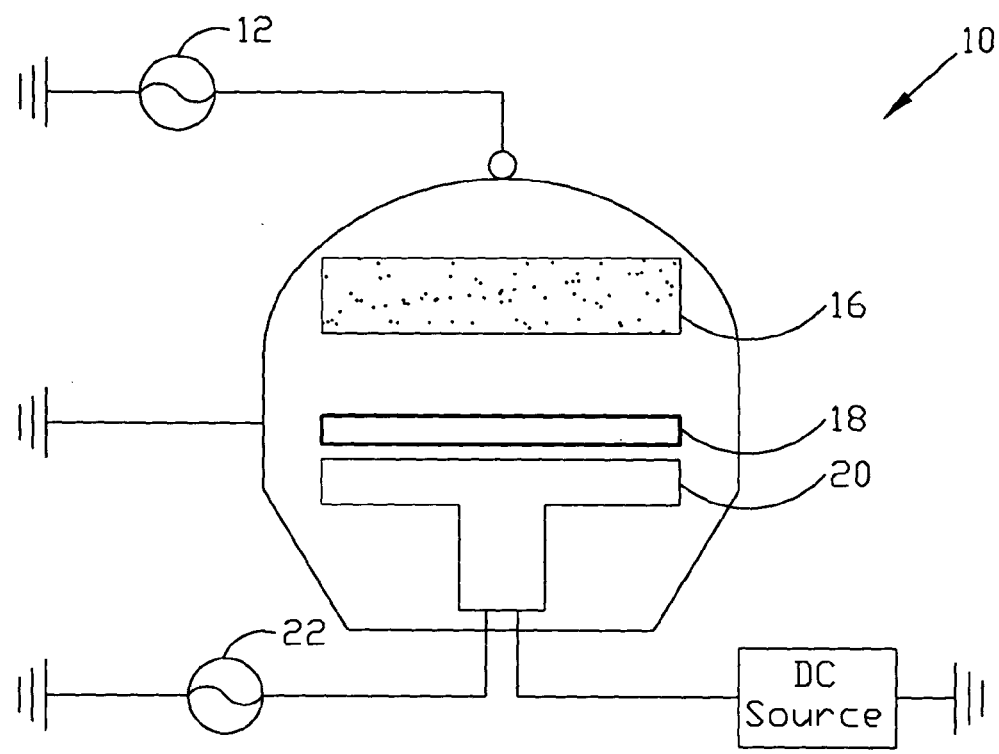
FIG. 1A shows an illustrative chart of HDPCVD equipment of the prior art.
Figure 1B:
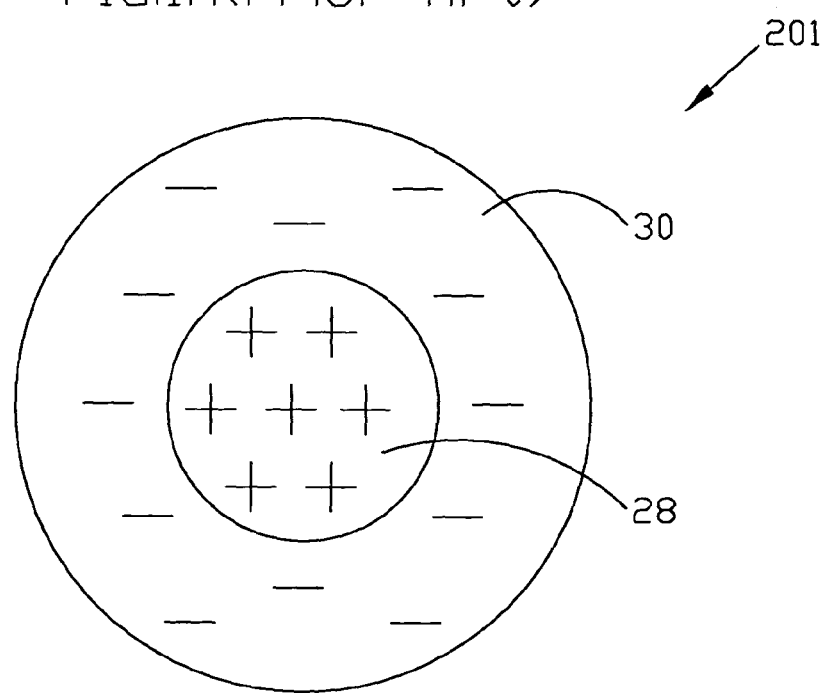
FIG. 1B shows a top view of distribution of electric particles on a bi-polar electrostatic chuck of the prior art.
Figure 1C:
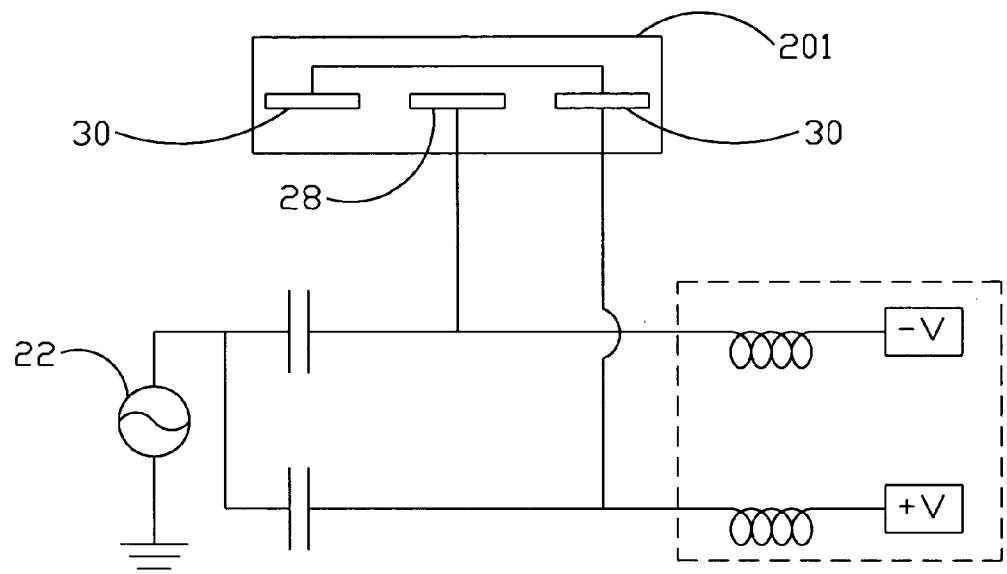
FIG. 1C shows an equivalent circuit of the connection between an AC bias power for generating ion-bombardment and a DC (direct current) power for generating an electrostatic force on a bi-polar electrostatic chuck of the prior art.
Figure 2A:
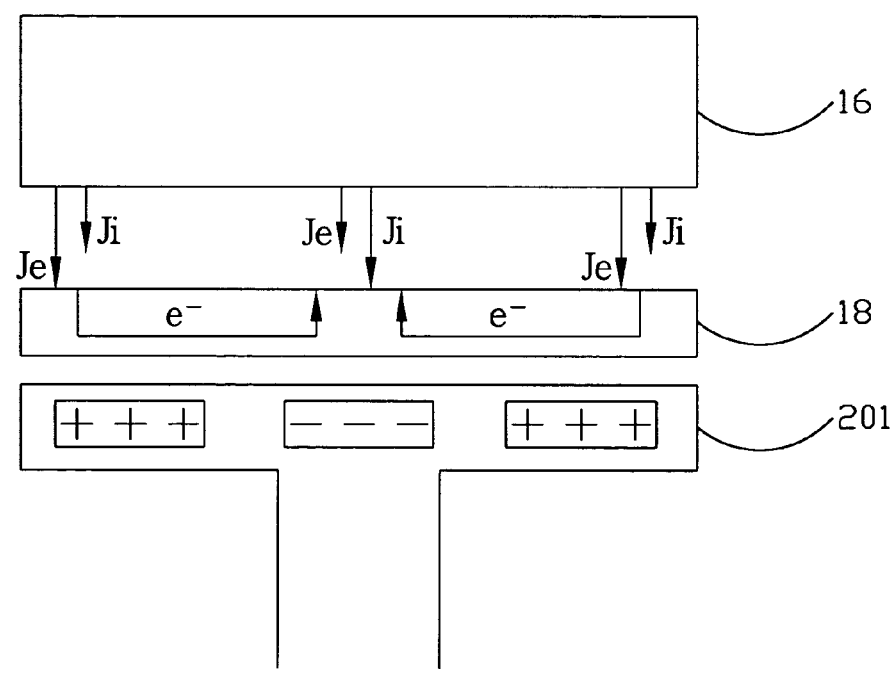
FIG. 2A shows surface currents on a wafer resulting from the power difference between the inner electrode and the outer electrode of a bi-polar electrostatic chuck of the prior art.
Figure 2B:
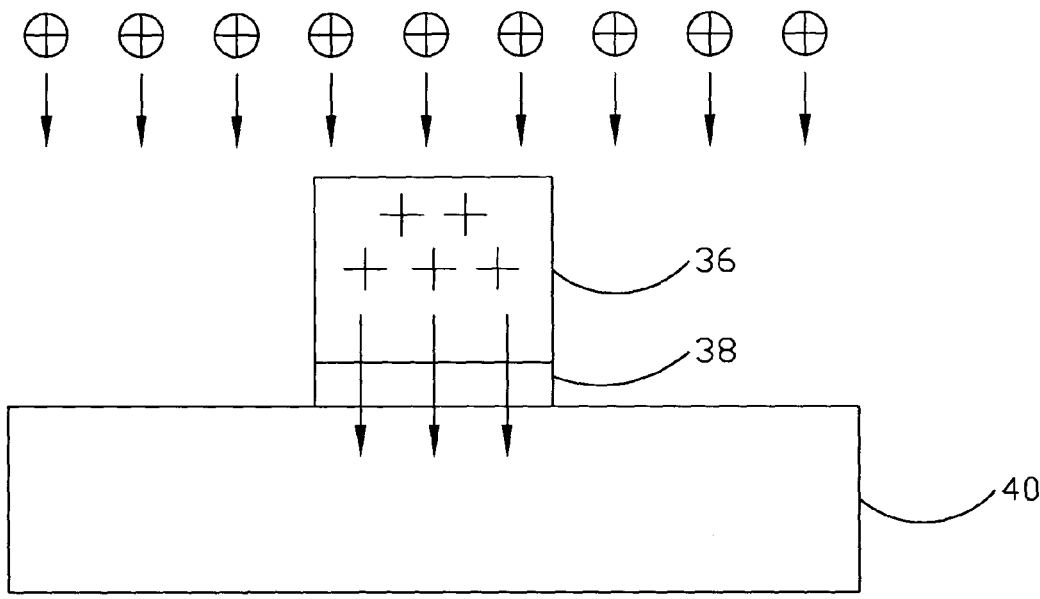
FIG. 2B shows accumulated electric particles resulting from ion-bombardment on a conductive poly-silicon layer passing through a gate oxide to damage the gate oxide of the prior art.
Figure 3A:
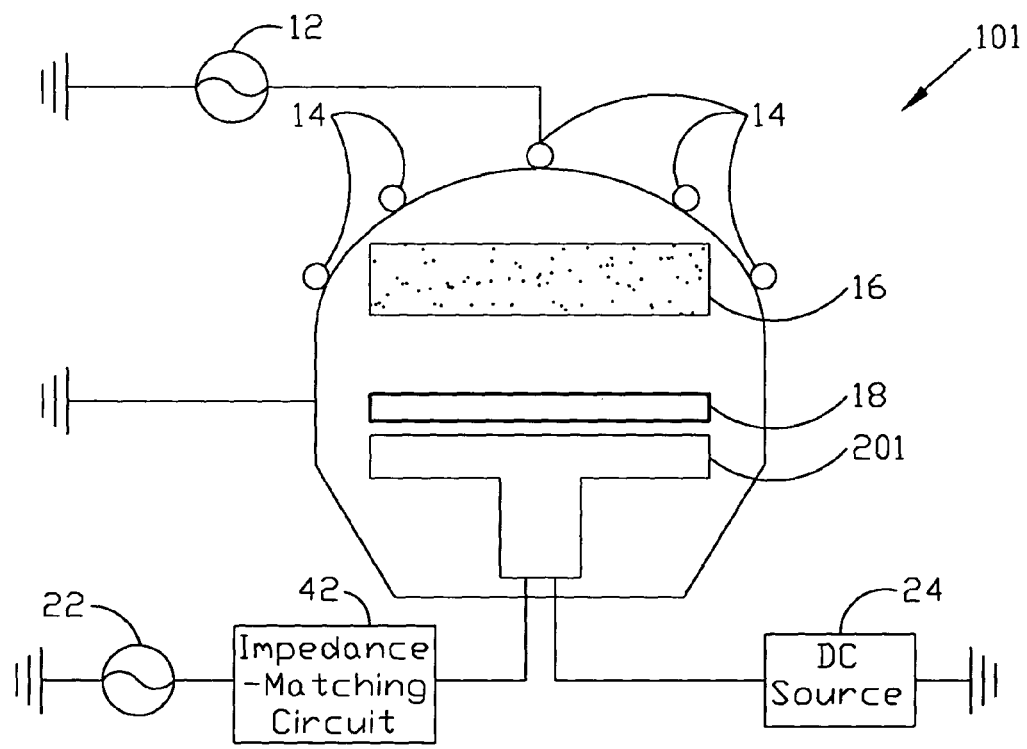
FIG. 3A shows an illustrative chart of an inductively-coupled plasma reactor.

As shown in FIG. 3A, the apparatus capable of adaptive impedance matching of the present invention mainly applies to HDPCVD equipment. The HDPCVD equipment of the present invention is an inductively-coupled plasma reactor 101. The plasma 16 of high density and low energy is generated by an electromagnetic field produced by AC currents from an AC plasma generating power 12 passing through the inductive coils 14. In the preferred embodiment, the operating frequency of the AC plasma generating power 12 is nearly between 200 KHz and 350 KHz.

In HDPCVD process (such as the deposition of inter-metal dielectrics), before proceeding with the deposition of dielectrics, a wafer 18 desired to be deposited has to be secured onto a bi-polar electrostatic chuck 201. The bi-polar electrostatic chuck 201 is connected to a DC power 24 to produce an electrostatic force to secure the wafer 18 onto the bi-polar electrostatic chuck 201. After the HDPCVD process is over, the bi-polar electrostatic chuck 201 can provide a discharging circuit to remove the electrostatic force more rapidly than a mono-polar electrostatic chuck does to move the wafer 18 out of the inductively-coupled plasma reactor 101.

Depositing dielectric materials into gaps of high aspect ratio in a dielectric layer always leads to incomplete deposition and voids in the dielectric layer. The problem can be solved by means of both chemical vapor deposition process and anisotropic etching process of ion-bombardment of the HDPCVD process. In the present invention, the ion-bombardment results from an AC bias power 22. The AC bias power 22 connects to the bi-polar electrostatic chuck 201 for supporting the wafer 18. Then a DC self bias will be generated because of the surface area difference between the bi-polar electrostatic chuck 201 and the inductively-coupled plasma reactor 101. The generated DC self bias will attract ions in the plasma 16 to bombard onto the surface of the wafer 18 to etch excess deposited materials which stop following deposition. Further, a void-free deposition layer will be formed. The operating frequency of the AC bias power is about 13.56 MHz.

Figure 3B:
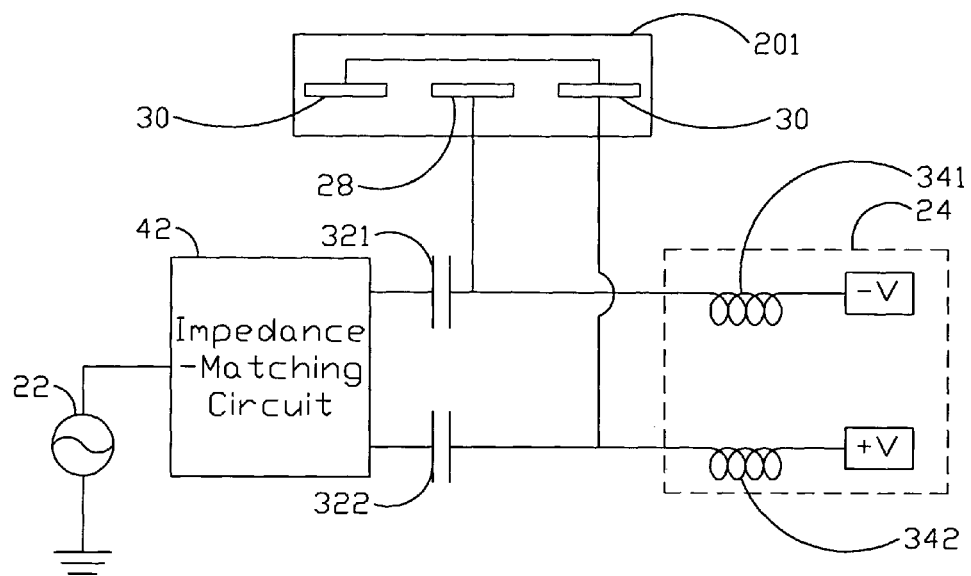
FIG. 3B shows an equivalent circuit of the connection between an AC bias power for generating ion-bombardment and a DC (direct current) power for generating an electrostatic force on a bi-polar electrostatic chuck after adding an impedance-matching circuit.

As shown in FIG. 3B, the bi-polar electrostatic chuck has an inner electrode 28 and an outer electrode 30. The inner electrode 28 and the outer electrode 30 both connects to the DC power 24 and the AC bias power 22. The capacitive impedance 321 for isolation of the inner electrode 28 and the capacitive impedance 322 for isolation of the outer electrode 30 are used to prevent direct currents from entering the AC bias power 22 because capacitors to direct currents are open-circuit (capacitive impedance $Zc=1/j\omega C$, the frequency of direct current $\omega=0$, $Zc=\infty$). The inductive impedance 341 for isolation of the inner electrode 28 and the inductive impedance 342 for isolation of the outer electrode 30 are used to prevent alternating currents from entering the DC power 24.

The capacitive impedance 321 for isolation of the inner electrode 28 and the capacitive impedance 322 for isolation of the outer electrode 30 have different impedance values because of different transmitting lines. The different impedance values will lead to the power outputs difference between the inner electrode 28 and the outer electrode 30 (the power of AC bias power 22 $P_{generator}$ minus the power of the consumption of the impedance $P_{impedance}$ equals to power output $P_{out}$). In this situation when proceeding with ion-bombardment onto the wafer 18, surface currents will be generated. Surface currents on the wafer 18 will damage the gate oxides of the devices on the wafer 18. To avoid damaging the gate oxides of the devices on the wafer 18, the inner electrode 28 power output and the outer electrode 30 of the bi-polar electrostatic chuck 201 power output should be the same. That is to say the impedance of the inner electrode 28 and the impedance of the inner electrode 30 have the same impedance values. To achieve this goal, an impedance matching circuit 42 is added in the present invention connecting the AC bias power 22 to the capacitive impedance 321 for isolation of the inner electrode 28 and the capacitive impedance 322 for isolation of the outer electrode 30 to let the capacitive impedance 321 for isolation of the inner electrode 28 and the capacitive impedance 322 for isolation of the outer electrode 30 have the same impedance values. And then the inner electrode power output will be the same with the outer electrode power output to avoid damaging gate oxides of the devices on the wafer 18.

Figure 3C:
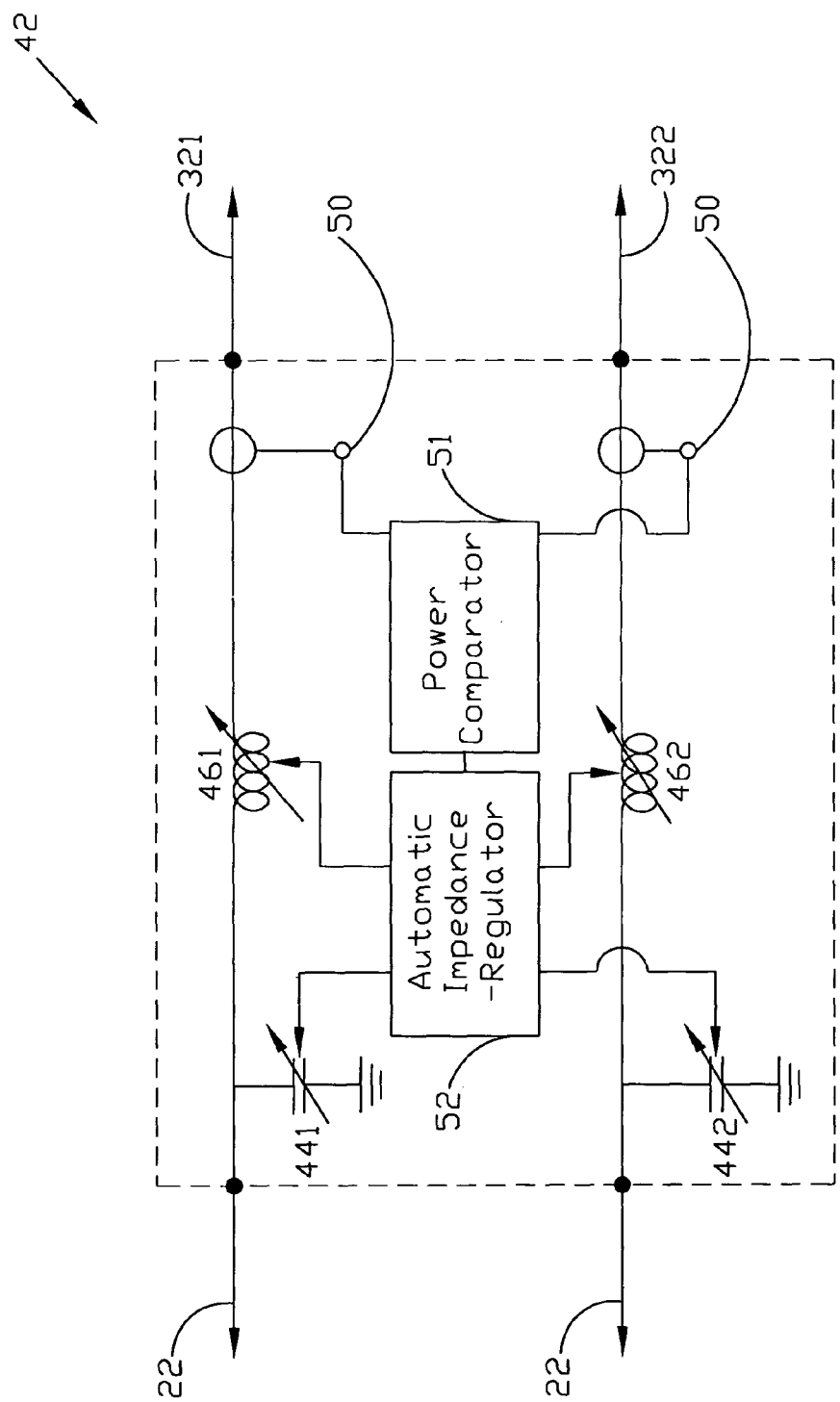
FIG. 3C shows the equivalent circuit of an impedance-matching circuit.

One preferred embodiment of the present invention is as shown in FIG. 3C, the impedance matching circuit mainly includes an adjustable capacitor 441 of the inner electrode 28, an adjustable capacitor 442 of the outer electrode 30, an adjustable inductor 461 of the inner electrode 28, an adjustable inductor 462 of the outer electrode 30, a power-measuring device 50, a power comparator 51, and an automatic impedance-regulator 52. One terminal of the impedance matching circuit 42 connects to the AC bias power 22 and the other terminal of the impedance matching circuit 42 connects to both the capacitive impedance 321 for isolation of the inner electrode 28 and the capacitive impedance 322 for isolation of the outer electrode 30.

Figure 4:
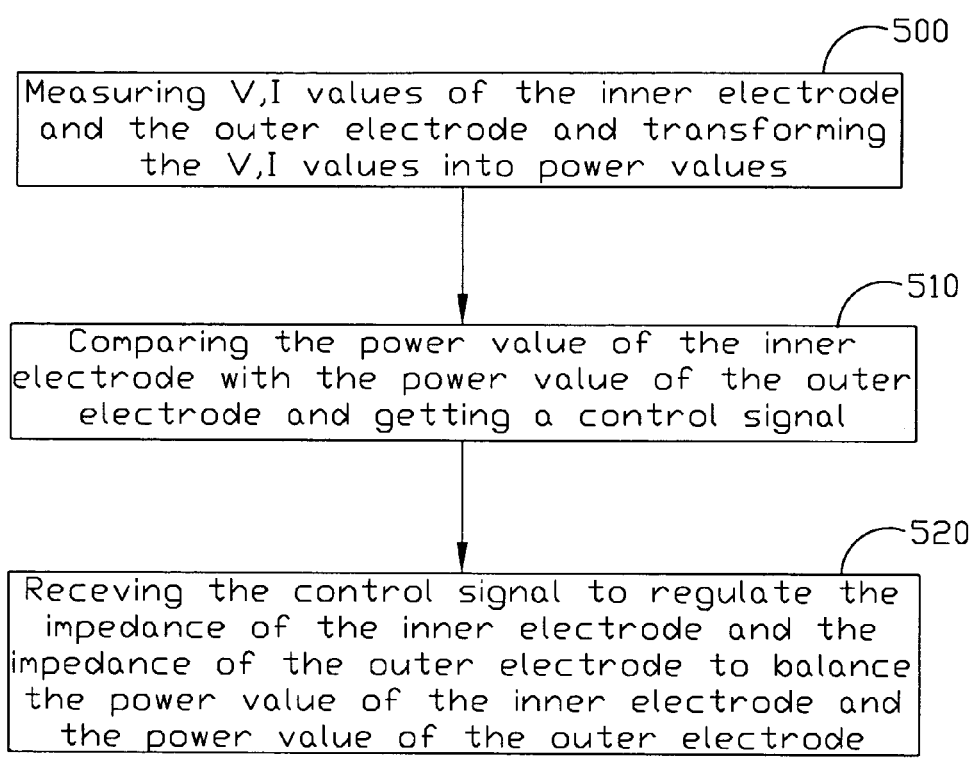
FIG. 4 shows a flow chart of adjusting impedance values of both the inner electrode and the outer electrode of a bi-polar electrostatic chuck.

The way of impedance-matching provided by the present invention includes the following steps: as shown by the power-measuring block 500 in FIG. 4 a power-measuring device 50 which can measure the voltage and the current of both the inner electrode 28 and the outer electrode 30 of the bi-polar electrostatic chuck 201 and transform the voltage values and the current values into power output values of the inner electrode 28 and the outer electrode 30 of the bi-polar electrostatic chuck 201, as shown by the power-comparing block 510 a power comparator 51 which can compare the power value of the inner electrode 28 and the power value of the outer electrode 30 to get a control signal, as shown by the automatic impedance-matching block 520, and an automatic impedance-regulator 52 which can receive the control signal to drive the logic drive motors to regulate the impedance values of the adjustable impedance-elements to let the inner electrode 28 and the outer electrode 30 of the bi-polar electrostatic chuck 201 have the same power output. Proceeding with the HDPCVD process at this time will not produce the voltage potential difference between the inner portion and the outer portion of the wafer 18 when the wafer 18 are bombarded by a plurality of ions because the inner electrode 28 power output is the same with the outer electrode 30 power output.

What is said above is only a preferred embodiment of the invention, which is not to be used to limit the claims of the invention; any change of equal effect or modifications that do not depart from the essence displayed by the invention should be limited in what is claimed in the following.

What is claimed is:

1. A plasma apparatus capable of adaptive impedance matching, comprising:
    a plasma reactor which produces plasma to proceed with chemical vapor deposition process;
    a bi-polar electrostatic chuck which locates inside said plasma reactor to support and secure a wafer and said bi-polar electrostatic chuck has an inner electrode and an outer electrode;
    an alternating current bias power which connects to said inner electrode and said outer electrode, and said alternating current bias power provides the bias for ion-bombardment on said wafer; and
    an impedance matching circuit, said impedance matching circuit connects between said alternating bias power, said inner electrode and said outer electrode of said bi-polar electrostatic chuck in order to balance a power output of said inner electrode power and a power output of said outer electrode and said impedance matching circuit includes
    a plurality of adjustable inductors, wherein a first terminal of said plurality of adjustable inductors connects to an external circuit and a second terminal of said plurality of adjustable inductors connects to an alternating current bias power;
    a plurality of adjustable capacitors, wherein a first terminal of said plurality of adjustable capacitors connects to a second terminal of said plurality of inductors and a second terminal of said plurality of adjustable capacitors connects to the ground;
    a power-measuring device which connects to said second terminal of said plurality of adjustable inductors to measure the power outputs of said second terminal of said plurality of adjustable inductors;
    a power comparator which connects to said power-measuring device and produces a control signal for automatic impedance regulation; and
    an automatic impedance-regulator which connects with said plurality of adjustable inductors, said plurality of adjustable capacitors, and said power comparator, wherein said automatic impedance-regulator receives said control signal for automatic impedance regulation to regulate the impedance values of said plurality of adjustable inductors and the impedance values of said plurality of adjustable capacitors.

2. The plasma apparatus capable of adaptive impedance matching according to claim 1, wherein said plasma reactor has an alternating current plasma generating power.

3. The plasma apparatus capable of adaptive impedance matching according to claim 2, wherein the operating frequency of said alternating current plasma generating power is approximately between 200 KHz and 350 KHz.

4. The plasma apparatus capable of adaptive impedance matching according to claim 1, wherein the operating frequency of said alternating current bias power is about 13.56 MHz.

5. The plasma apparatus capable of adaptive impedance matching according to claim 1, wherein said power-measuring device has a voltage-meter for measuring amplitudes and phases of voltages and a current-meter for measuring amplitudes and phases of currents.

6. The plasma apparatus capable of adaptive impedance matching according to claim 1, wherein said power comparator has a transmitter for sending said control signal.

7. The plasma apparatus capable of adaptive impedance matching according to claim 1, wherein said automatic impedance-regulator has a receiver for receiving said control signal.

8. The plasma apparatus capable of adaptive impedance matching according to claim 1, wherein said automatic impedance-regulator has a plurality of logic drive motors.

9. High density plasma chemical vapor deposition equipment with an impedance-matching circuit, comprising:
    an inductively-coupled plasma reactor which has an alternating current plasma generating power and said alternating current plasma generating power produces plasma to proceed with a high density plasma chemical vapor deposition process;
    a bi-polar electrostatic chuck which locates inside said inductively-coupled plasma reactor to support and secure a wafer and said bi-polar electrostatic chuck has an inner electrode and an outer electrode, wherein said inner electrode locates inside the center portion of said bi-polar electrostatic chuck and said outer electrode locates inside the outer portion of said bi-polar electrostatic chuck outside said inner electrode;

a direct current power which connects to said bi-polar electrostatic chuck and said direct current power provides plus power to said inner electrode of said bi-polar electrostatic chuck and minus power to said outer electrode of said bi-polar electrostatic chuck;

an alternating current bias power which connects to said inner electrode and said outer electrode and said alternating current bias power provides the bias for ion-bombardment on said wafer;

an isolating circuit which connects between said direct current power and said alternating bias power, wherein said isolating circuit has a plurality of capacitors and a plurality of inductors, wherein said plurality of capacitors are used to prevent direct currents from flowing into said alternating current bias power and said plurality of inductors are used to prevent alternating currents from flowing into said direct current power; and an impedance matching circuit, said impedance matching circuit connects said alternating bias power, said inner electrode and said outer electrode of said bi-polar electrostatic chuck and said impedance matching circuit includes a plurality of adjustable inductors, wherein a first terminal of said plurality of adjustable inductors connects to an external circuit and a second terminal of said plurality of adjustable inductors connects to an alternating current bias power;

a plurality of adjustable capacitors, wherein a first terminal of said plurality of adjustable capacitors connects to a second terminal of said plurality of inductors and a second terminal of said plurality of adjustable capacitors connects to the ground;

a power-measuring device which connects to said second terminal of said plurality of adjustable inductors to measure the power outputs of said second terminal of said plurality of adjustable inductors;

a power comparator which connects to said power-measuring device and produces a control signal for automatic impedance regulation; and an automatic impedance-regulator which connects with said plurality of adjustable inductors, said plurality of adjustable capacitors, and said power comparator, wherein said automatic impedance-regulator receives said control signal for automatic impedance regulation to regulate the impedance values of said plurality of adjustable inductors and the impedance values of said plurality of adjustable capacitors.

10. The high density plasma chemical vapor deposition equipment with an impedance-matching circuit according to claim 9, wherein said power-measuring device has a voltage-meter for measuring amplitudes and phases of voltages and a current-meter for measuring amplitudes and phases of currents.

11. The high density plasma chemical vapor deposition equipment with an impedance-matching circuit according to claim 9, wherein said power comparator has a transmitter for sending said control signal.

12. The high density plasma chemical vapor deposition equipment with an impedance-matching circuit according to claim 9, wherein said automatic impedance-regulator has a receiver for receiving said control signal.

13. The high density plasma chemical vapor deposition equipment with an impedance-matching circuit according to claim 9, wherein said automatic impedance-regulator has a plurality of logic drive motors.

* * * * *